(12) United States Patent
Cheetham et al.

(10) Patent No.: US 8,252,506 B2
(45) Date of Patent: Aug. 28, 2012

(54) HOT MELT COMPOSITIONS

(75) Inventors: Kevin J. Cheetham, Sutton, MA (US); Thomas C. Sutter, Holden, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 309 days.

(21) Appl. No.: 12/590,209

(22) Filed: Nov. 4, 2009

(65) Prior Publication Data

US 2010/0129754 A1 May 27, 2010

Related U.S. Application Data

(60) Provisional application No. 61/198,190, filed on Nov. 4, 2008.

(51) Int. Cl.
- *G03F 7/00* (2006.01)
- *G03F 7/004* (2006.01)
- *G03F 7/26* (2006.01)
- *G03F 7/40* (2006.01)

(52) U.S. Cl. .............. 430/270.1; 430/322; 430/325; 430/326; 430/330; 430/331; 430/314

(58) Field of Classification Search ............ 430/270.1, 430/322, 325, 326, 330, 331, 314
See application file for complete search history.

(56) References Cited

U.S. PATENT DOCUMENTS

| | | | |
|---|---|---|---|
| 3,964,915 A | 6/1976 | Doenges et al. | |
| 4,113,525 A | 9/1978 | Stayner et al. | |
| 4,122,032 A | 10/1978 | Höllerich | |
| 4,177,076 A * | 12/1979 | Sato ............... | 524/389 |
| 4,499,163 A * | 2/1985 | Ishimaru et al. ........... | 430/5 |
| 5,217,798 A | 6/1993 | Brady et al. | |
| 5,507,864 A | 4/1996 | Jaeger et al. | |
| 5,852,080 A | 12/1998 | Philbin et al. | |
| 5,922,114 A | 7/1999 | Sawada | |
| 5,954,865 A | 9/1999 | Sawada | |
| 6,742,884 B2 | 6/2004 | Wong et al. | |
| 6,764,710 B2 | 7/2004 | Merdan et al. | |
| 6,872,320 B2 | 3/2005 | Wong et al. | |
| 6,890,982 B2 | 5/2005 | Borsinger et al. | |
| 7,166,402 B2 | 1/2007 | Veregin et al. | |
| 7,384,568 B2 | 6/2008 | Wong et al. | |
| 7,427,360 B2 * | 9/2008 | Hopper et al. .............. | 216/13 |
| 7,915,326 B2 * | 3/2011 | Oguchi et al. .............. | 523/160 |
| 2005/0287459 A1 | 12/2005 | Moffat et al. | |
| 2006/0019077 A1 * | 1/2006 | Hopper et al. ........... | 428/209 |
| 2006/0047017 A1 * | 3/2006 | Miyamoto et al. ......... | 523/161 |
| 2006/0219133 A1 * | 10/2006 | Sakamoto et al. ......... | 106/31.65 |
| 2006/0219976 A1 | 10/2006 | Yamamiya et al. | |
| 2007/0120922 A1 * | 5/2007 | Belelie et al. .............. | 347/100 |
| 2010/0013690 A1 * | 1/2010 | Kuramochi et al. ........ | 341/155 |
| 2010/0313788 A1 * | 12/2010 | Drappel et al. ............ | 106/31.29 |
| 2011/0148979 A1 * | 6/2011 | Breton et al. ............. | 347/20 |
| 2011/0152397 A1 * | 6/2011 | Breton et al. ............. | 522/42 |

FOREIGN PATENT DOCUMENTS

| | | |
|---|---|---|
| CA | 1298754 | 4/1992 |
| EP | 0 676 454 | 10/1995 |
| WO | WO 02/053659 | 7/2002 |
| WO | WO 2004/026977 | 4/2004 |
| WO | WO 2004/028244 | 4/2004 |
| WO | WO 2004/106437 | 12/2004 |
| WO | WO 2007/119966 A1 | 10/2007 |
| WO | WO 2008/021780 | 2/2008 |

OTHER PUBLICATIONS

Standard Operating Procedures of Tufts Emergency Medical Services; "Aluminum Etch"; Faculty Supervisor: Prof. Robert White; Jul. 16, 2008; pp. 1-2.

* cited by examiner

*Primary Examiner* — Amanda C. Walke
(74) *Attorney, Agent, or Firm* — John J. Piskorski

(57) ABSTRACT

Hot melt compositions include acid waxes and acrylate functional monomers free of acid groups. Upon application of actinic radiation, the hot melt compositions cure to form and etch resist. The hot melt compositions may be used in the manufacture of printed circuit boards, optoelectronic and photovoltaic devices.

9 Claims, No Drawings

HOT MELT COMPOSITIONS

The present invention is directed to hot melt compositions which cure upon exposure to actinic radiation and function as plating resists and etch resists and are readily strippable from substrates. More specifically, the present invention is directed to hot melt compositions which cure upon exposure to actinic radiation and function as plating resists and etch resists, are readily strippable from substrates and include high acid value waxes in combination with acrylate monomers free of acid groups.

Hot melts are in solid phase at ambient temperatures, but exist in liquid phase at elevated operating temperatures in ink jet printing devices. At the ink jet operating temperatures droplets of liquid hot melt are ejected from the printing device and, when the droplets contact a surface of a printing material, they harden to form a predetermined pattern of droplets.

Hot melts have been employed in direct and transfer printing processes. Hot melts are typically cast into solid sticks and placed into an ink jet printing device. The temperature of the ink jet device is raised to an operating temperature where a liquid phase with selective fluid properties is formed. The hot melt is then held as a liquid at the operating temperature in a reservoir and printhead of the ink jet printer. The hot melt in its liquid phase may then be applied in a predetermined pattern onto a substrate. While hot melts have been used for some time in the conventional printing industry, the electronics industry is beginning to appreciate the potential use of such compounds to address the problems in the manufacture of electronic devices, such as in the manufacture of printed circuit boards (PCBs).

PCBs are typically made by complex processes such as with dry film negative photoresist processes involving six or more stages. Firstly, a dielectric substrate is laminated or coated with copper and the copper surface is then overlaid with a photoresist layer. A photo-tool is prepared which is a negative of the required electrically conductive circuitry of the printed circuit. The photo-tool is placed directly over the photoresist layer to polymerise and harden in those areas exposed to the UV light to produce a latent image of the required electrically conductive circuitry in the phtoresist layer. The photoresist layer is then developed to remove the unexposed area of the photoresist. This chemical treatment is typically mildly alkaline where the photoresist layer contains free carboxylic groups.

The exposed copper is then selectively removed by chemical etching from those areas not protected by the phtotoresistant layers. Finally, the exposed areas of the photoresist layer are removed chemically, for example using stronger aqueous alkali where the photolayer contains free carboxylic acid groups.

Although the process is widely used in the manufacture of PCBs it is tedious, expensive and wasteful of materials since the photoresist layer is made separately and applied over the total area of the copper/dielectric substrate laminate. Furthermore, the photo-tool containing the negative image of the desired electrically conductive circuitry is often distanced from the photo-tool layer such that diffraction of UV light irradiation occurs leading to development and polymerization in areas of the photoresist not directly beneath the UV transparent areas of the photo-tool. Such problems must be taken into consideration when preparing photo-tools and may reduce the density and definition of the electrically conductive circuitry. Furthermore, the chemical structure of the photoresist must be carefully controlled since its removal both before and after exposure to UV light depends on the alkaline treatment. The density and integrity of the intended electrically conductive circuitry can be seriously compromised if either the unexposed photoresist is incompletely removed or if some of the exposed and polymerized photoresist is removed prior to chemically etching the copper. Accordingly, there exits a significant attraction in applying a photoresist or similar material to specific areas of a copper/dielectric laminate using ink jet printing technology since it removes the need for a photo-imaging and developing step.

When ink jet printing, the image or negative image is made digitally available direct from a computer, the number of process steps is halved, and the need for differential removal of the photoresist using different strengths of aqueous alkali is avoided. Also, since there is no photo-tool which is distanced from the photoresist layer there is a potential for improved definition and density of the circuitry. There also exists the cost saving in terms of photoresist material since the photoresist is only applied to those areas to be protected from chemical etching.

Substantially complete removal of photoresists or similar materials is highly desirable for workers in the lithographic arts. If photoresist residue is left on a substrate after removal, the residue may compromise further processing of the substrate. For example, photoresists may be deposited on a PCB to function as a negative mask for forming a circuit pattern. Sections of the substrate which are not covered by the mask are etched away using an etchant and the photoresist is then stripped. Subsequent steps typically involve a bonding step or one or more metal plating processes. Any residue remaining on the PCB after stripping may compromise bonding or metal plating resulting in a defective electronic device.

In addition to substantially complete removal, rapid removal of the photoresists is also important to workers in the lithographic industry. Since much of the manufacturing of electronic devices involves assembly line type processes, the more rapid the removal the more efficient the overall manufacturing process. Accordingly, there is a need for photoresists or similar materials which can be rapidly and completely removed from a substrate.

U.S. Pat. No. 7,427,360 discloses a process for making an electronic device by an ink jetting process using an etch-resistant ink in place of conventional photoresist imaging methods. The ink includes: a) 30 to 90 parts acrylate functional monomers free from acid groups comprising mono or higher functionality where 5-95% by weight is one or more mono functional monomers; b) 1 to 30 parts acrylate functional monomer containing one or more acid groups; c) 0 to 20 parts polymer or prepolymer; d) 0 to 20 parts radical initiator; e) 0 to 5 parts colorant; f) 0 to 5 parts surfactant; and the ink has a viscosity of not greater than 30 cPs (mPa·s) at 40° C. The ink is substantially solvent free and is polymerizable by actinic or particle beam radiation. The ink may be stripped from a substrate using a base.

Although there are ink jettable compositions and methods which may be used to manufacture electronic devices in place of conventional photoresist imaging methods, there is still a need for improved ink jettable formulations and methods to manufacture electronic devices.

In one aspect a composition includes one or more acid waxes, one or more acrylate functional monomers free of acid groups and one or more radical initiators.

In another aspect a method includes:
a) providing a composition including one or more acid waxes, one or more acrylate functional monomers free of acid groups and one or more radical initiators;
b) selectively depositing the composition on a substrate;
c) applying actinic radiation to the composition to cure the composition;

d) etching sections of the substrate not covered with the cured composition; and
e) removing the cured composition from the substrate with a base to form a patterned article.

In a further aspect a method includes:
a) providing a composition comprising one or more acid waxes, one or more acrylate functional monomers free of acid groups and one or more radical initiators;
b) selectively depositing the composition on a substrate;
c) applying actinic radiation to the composition to cure the composition;
d) plating metal onto the sections of the substrate not covered with the cured composition; and
e) removing the cured composition with a base to form a patterned article.

The compositions are free of any acid group containing acrylate functional monomers. The acid groups which enable the compositions to be removed from substrates using base are included in the acid wax component which enables a more rapid and substantially complete removal of the compositions from substrates. The acid wax values of the wax component are at least 50 mg of KOH/g. The compositions are also substantially free of solvents, thus the compositions eliminate undesirable solvents which may be toxic to workers and the environment.

The compositions which are hot melts may be applied to substrates by conventional ink jet apparatus as well as by conventional screen printing methods and by conventional spray apparatus which may have nano- to macro-deposition capability. The compositions are used as resists. They may be used as a plating resist or as an etch resist. The compositions and methods may be used in the manufacture of components of electronic devices, such as PCBs and lead frames, optoelectronic devices, photovoltaic devices, in the metal finishing of parts and precision tooling. They have good image definition and low flow due to their phase change nature.

As used throughout this specification, the following abbreviations have the following meanings, unless the context indicates otherwise: ° C.=degrees Centigrade; g=grams; L=liters; mL=milliliters; cm=centimeters; μm=microns; dm=decimeters; Å=angstroms=$10^{-4}$ microns; amp.=amperes; mJ=milliJoules; W=Watts=Amps×Volts; wt %=percent by weight; cp=centipoise; UV=ultraviolet; IR=infrared; and psi=pounds/inch$^2$=0.06805 atmospheres=$1.01325\times10^6$ dynes/cm$^2$ The terms "printed wiring board" and "printed circuit board" are used interchangeably throughout this specification. "Actinic radiation" means electromagnetic radiation that can produce photochemical reactions. "Viscosity"=internal fluid friction or the ratio of the shear stress to the rate of shear of a fluid. "Acid value or acid number"=grams of potassium hydroxide required to neutralize 1 gm of free acid, and to measure the free acid present in a substance. All percentages are by weight, unless otherwise noted and are based on dry weight or solvent free weight. All numerical ranges are inclusive and combinable in any order, except where it is logical that such numerical ranges are constrained to add up to 100%.

The combination of acid waxes and acrylate functional monomers free of acid groups provide a composition which is a hot melt and may be used as a resist, such as an etch resist or a plating resist, and at the same time is strippable from substrates using base strippers such that substantially all of the composition is removed from the substrate. The compositions are resistant to acid etchants, such as hydrofluoric acid, nitric acid, sulfuric acid, phosphoric acid, organic acids, such as carboxylic acids and mixtures thereof, and to industrial etches such as cupric chloride ($CuCl_2$) and ferric chloride ($FeCl_3$). The compositions are readily stripped from substrates using base strippers such as organic amines which include alkanolamines, alkali metal hydroxides, which include potassium, sodium hydroxide and mixtures thereof, and alkali carbonates and bicarbonates. Conventional strengths of both the etchants and strippers may be used.

The compositions also include one or more radical initiators which enable the compositions to be cured upon application of actinic radiation. Conventional methods known in the art may be used as sources of actinic radiation, such as actinic radiation in the IR, UV and visible ranges as well as to X-rays and microwaves.

The compositions are free of organic solvents as well as water. This means that no additional solvents or water are included in the compositions and only trace amounts of solvents or water may be present as impurities or as by-products in the manufacture of various components used to make the compositions. Typically, the compositions are 100 wt % solids. They are low flowing, thus they form printed dots with aspect ratios (height to width) in the range of 0.05 to 0.25, or such as from 0.08 to 0.18. They also form images having good image definition.

Viscosities of the compositions are such that they may be used with many conventional ink jet apparatus. Typically, the viscosities of the compositions range from 5 cp to 80 cp at 40° C. to 150° C. Viscosity may be measured by conventional methods but is typically measured using a Brookfield viscometer with a rotating spindle, for example a number 18 spindle.

Ink jet apparatus may digitally store information in its memory for a selective resist design to be applied to a substrate. Examples of suitable computer programs are standard CAD (computer aided design) programs for generation of tooling data. Workers may readily modify the selective deposition of the compositions by changing the program digitally stored in the ink jet apparatus. Additionally, registration problems also may be readily addressed. The ink jet apparatus may be programmed to perceive potential incorrect alignment between substrates, such as in the manufacture of multi-layer PCBs. When the apparatus senses misregistration between boards, the program modifies the ink jet application of the resist mask pattern to avoid or correct misregistration between adjacent boards. The ability to re-design the pattern from board to board reduces the potential for misregistration between the boards, and eliminates the costly and inefficient task of preparing multiple fixed phototools. Accordingly, efficiency of selective deposition of the resist and image formation is improved over many conventional methods.

There are two major categories of ink jet printing, "Drop-On-Demand" ink jet and "Continuous" inkjet. Using Drop-On-Demand inkjet technology the resist composition is stored in a reservoir and delivered to a nozzle in the print head of the printer. A means exists to force a single drop of composition out of the nozzle and onto a substrate. Typically this is a piezo electric actuation of a diaphragm within a chamber, which "pumps" the droplets out of the nozzles, or a localized heating of the fluid to increase the pressure within the chamber, thus forcing a droplet to eject.

In "continuous" inkjet printing, a continuous stream of resist composition is delivered to a nozzle in the print head of the printer. Prior to passing out of the nozzle, the pressurized composition stream proceeds through a ceramic crystal subjected to an electric current. This current causes a piezoelectric vibration equal to the frequency of AC (alternating current) electric current. This vibration, in turn, generates droplets of the composition from the unbroken stream. The composition breaks up into a continuous series of drops, which are equally spaced and of equal size. Surrounding the jet at the point where the drops separate from the liquid stream in a charge electrode a voltage is applied between the charge electrode and the drop stream. When the drops break off from the stream, each drop carries a charge proportional to the applied voltage at the instant at which it breaks off. By varying the charge electrode voltages at the same rate as drops are produced every drop may be charged to a predetermined level. The drop stream continues its flight and passes between two deflector plates, which are maintained at a constant potential such as +/−0.1 kV to +/−5 KV, or such as +/−1 kV to +/−3 kV. In the presence of this field, a drop is deflected towards one of the plates by an amount proportional to the charge carried. Drops, which are uncharged, are undeflected and collected into a gutter to be recycled to the ink nozzle. Drops which are charged and hence deflected impinge on a radiant energy sensitive material traveling at right angles to the direction of drop deflection. By varying the charge on individual drops, a desired pattern can be applied. Drop sizes may range from 30 µm to 100 µm, or such as from 40 µm to 80 µm, or such as from 50 µm to 70 µm in diameter.

The inkjet processes are adaptable to computer control for high-speed application of continuously variable data. Ink jet printing methods may be divided into three general categories: high pressure (10 psi and greater), low pressure (less than 10 psi) and vacuum techniques. All are known in the art or described in the literature and can be employed in the application of the resist compositions to substrates.

In addition to application by ink jet, the resist compositions may be applied by using screen printing and by spray apparatus having nano- to macro-deposition capability. An example of one type of spray apparatus which may be used is the M³D® which is available from Optomec®.

The resist compositions may be prepared by any suitable method known in the art. The waxes, acrylate functional monomers free of acid groups and radical initiators which are included in the compositions typically are solids or semi-solids at room temperatures. They may be combined together in any order. They may be heated to soften or liquefy them such that they may be readily mixed together or with any additional components. Components may be combined in any order in a conventional mixing or homogenizing apparatus. Temperatures of above 25° C. to 150° C. typically are employed to mix the components. After the components are uniformly mixed the mixture may be cooled to 25° C. or below to form a solid composition.

Any acid wax or combinations of acid waxes which provide desired etch or plating resistance, flow, definition and stripping ability may be included in the compositions. Acid functionality of the compositions is substantially limited to the acid waxes. Typically, high acid waxes and mixtures thereof are used. The term "high acid waxes" means a wax that has a high acid content of 50 mg KOH/g and greater and are 50% and greater acid functionalized. Typically, the high acid waxes have an acid content of 100 mg KOH/g and higher, more typically an acid content of 120 mg KOH/g to 170 mg KOH/g. One or more acid waxes may be blended together to achieve a desired acid value. The acid wax component determines the acid value of the resist composition. Such waxes are typically acid-containing crystalline polymeric waxes. The term "crystalline polymeric waxes" means a wax material that contains an ordered array of polymer chains within a polymer matrix which can be characterized by a crystalline melting point transition temperature ($T_m$). The crystalline melting temperature is the melting temperature of the crystalline domains of a polymer sample. This is in contrast to glass transition temperature ($T_g$) which characterizes the temperature at which polymer chains begin to flow for the amorphous regions within a polymer. The acid waxes are included in the compositions in amounts of 0.5 wt % to 40 wt % of the composition, or such as from 5 wt % to 25 wt % of the composition.

Carboxylic acid-terminated polyethylene waxes which may be used in the compositions include, but are not limited to, mixtures of carbon chains with the structure $CH_3$—$(CH_2)_{n-2}$—COOH, where there is a mixture of chain lengths, n, where the average chain length is from 16 to 50 and linear low molecular weight polyethylene, of similar average chain length. Examples of such waxes include, but are not limited to, UNICID® 550 with n equal to 40, and UNICID® 700 with n equal to 50. Both are available from Baker Petrolite, (U.S.A.). UNICID® 550 includes 80% carboxylic acid functionality with the remainder a linear, low molecular weight polyethylene of a similar chain length, and an acid value of 72 mg KOH/g and a melting point of 101° C. Other examples of waxes have a structure of $CH_3$—$(CH_2)_n$—COOH, such as hexadecanoic or palmitic acid with n=16, heptadecanoic or margaric or daturic acid with n=17, octadecanoic or stearic acid with n=18, eicosanic or arachidic acid with n=20, docosanoic or behenic acid with n=22, tetracosanoic or lignoceric acid with n=24, hexacosanoic or cerotic acid with n=26, heptacosanoic or carboceric acid with n=26, heptacosanoic or carboceric acid with n=27, octacosanoic or montanic acid with n=28, triacontanoic or melissic acid with n=30, dotriacontanoic or lacceroic acid with n=32, titriacontanoic or ceromelissic or psyllic acid with n=33, tetratriacontanoic or geddic acid with n=34, pentatriacontanoic or ceroplastic acid with n=35.

Examples of other high acid waxes which are included in the compositions are high acid waxes with linear aliphatic chains of 16 and more carbon atoms. Typically, linear saturated, aliphatic waxes having an end-functionalized carboxylic acid are used. Such waxes have an acid value greater than 50 mg KOH/g. More typically, such high acid waxes are a montan wax, n-octascosanoic acid, $CH_3$—$(CH_2)_{26}$—COOH, 100% acid functionalized. Such waxes include, but are not limited to, Licowax® S, manufactured by Clariant GmbH (Germany), with an acid value of 127 to 160 mg KOH/g, Licowax® SW with acid values of 115 to 135 mg KOH/g, Licowax® UL with an acid value of 100 to 115 mg KOH/g and Licowax® X101 with acid values of 130 to 150 mg KOH/g. Other suitable high acid waxes include partly esterified montanic acid waxes, where some of the acid termination has been esterifed, such as Licowax® U with an acid value of 72 to 92 mg KOH/g.

The melting points of such acid waxes are from 65° C. to 150° C. Typically the melting points are from 80° C. to 110° C.

The acrylate functional monomers are free of any acid functional groups and contain a reactive vinyl group such as $CH_2$=C(R)CO— where R is hydrogen, alkyl or cyano. When R is alkyl it is typically $C_{1-6}$ alkyl. No acid functional monomers are included in the compositions. The other limitations on the monomers include their compatibility with each other, compatibility with the other components of the compositions, may not form separate phases in the final resist composition, have the prescribed viscosity and are removed by base treatment. The acrylate functional monomers have molecular weights of 30,000 or less, or such as 20,000 or less, or such as from 1,000 to 5,000. Typically, the molecular weight of the acrylate functional monomers free of acid groups is not greater than 2,000.

Specific examples of acrylate functional monomers free from acid groups are those which are commercially available under the Sartomer™, Actilane™ and Photomer™ trademarks, such as Sartomer™ 506 (isobornyl acrylate), Sartomer™ 306 (tripropylene glycol diacrylate), Actilane™ 430 (trimethylol propane ethoxylate triacrylate), Actilane™ 251 (a tri-functional acrylate oligomer), Actilane™ 411 (a CTF acrylate), Photomer™ 4072 (trimethylol propane propoxylate triacrylate), Photomer™ 5429 (a polyester tetra-acrylate) and Photomer™ 4039 (a phenol ethoxylate monoacrylate). Sartomer™, Actilane™ and Photomer™ are trademarks of Cray Valley Inc., Akros BV and Cognis Inc., respectively. Other examples of monomers are lauryl acrylate, isodecylacrylate, isooctyl acrylate, butyl acrylate, 2-hydroxy ethyl acrylate, 2-hydroxy propylacrylate, 2-ethyl hexyl acrylate, 1,6-hexanediol diacrylate, neopentyl glycol diacrylate, diethylene glycol diacrylate, butanediol diacrylate, trimethylolpropane triacrylate, pentaerythritol triacrylate, 1,3-butyleneglycol diacrylate, 1,4-butylene glycol diacrylate, triethylene glycol diacrylate, pentaerythritol tetra acrylate, tripropylene glycol diacrylate, isobornyl acrylate, 2-norbornyl acrylate, cyclohexyl acrylate, phenoxyethyl acrylate and tetra hydrofurfuryl acrylate. Such acrylate functional monomers free of acid functionality are included in the compositions in amounts of 50 wt % to 80 wt %, or such as from 60 wt % to 70 wt %.

Radical initiators may be any initiator including optional synergists which are typically used in the trade to initiate polymerization of acrylate functional monomers. The initiator and the synergist, when present may be activated by actinic radiation. Sources of actinic radiation include, but are not limited to, mercury lamps, xenon lamps, carbon arc lamps, tungsten filament lamps, light emitting diodes (LEDs), lasers, electron beam and sunlight. UV radiation is typically used, such as from medium pressure mercury lamps. Typically, the radical initiator is a photoinitiator activated by UV light.

Examples of radical initiators and synergists are anthraquinone, substituted anthraquinones such as alkyl and halogen substituted anthraquinones such as 2-tertiary butyl anthraquinone, 1-chloroanthraquinone, p-chloroanthraquinone, 2-methylanthraquinone, 2-ethylanthraquinone, octamethyl anthraquinone and 2-amylanthraquinone, optionally substituted polynuclear quinones such as 1,4-naphthaquinone, 9,10-phenanthraquinone, 1,2-benzanthraquinone, 2,3-benzanthraquinone, 2-methyl-1,4-napththoquinone, 2,3-dichloronaphthaquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetrahydronaphthaanthraquinone, 1,2,3,4-tetrahydrobenzanthracene-7,2-dione, acetophenones such as acetaphenone, 2,2-dimethoxy-2-phenyl acetophenone, 2,2-diethoxy-2-phenyl acetophenone, 1,1-dichloro acetophenone, 1-hydroxy cyclohexyl phehylketone and 2-methyl-1-(4-methylthio)phenyl-2-morpholin-propan-1-one; thioxanthones such as 2-methylthioxanthone, 2-decylthioxanthone, 2-dodecylthioxanthone, 2-isopropylthioxanthone, 2,4-dimethylthioxanthone, 2,4-diethylthioxanthone, 2-chlorothioxanthone and 2,4-diisopropylthioxanthone; ketals such as acetophenone dimethylketal and dibenzylketal; benzoins and benzoin alkyl ethers such as benzoin, benzylbenzoin methyl ether, benzoin isopropyl ether and benzoin isobutyl ether; azo compounds such as azobisisovaleronitrile; benzophenones such as benzophenone, methylbenzophenone, 4,4-dichlorobenzophenone, 4,4-bis-diethyl amino benzophenone, Michler's ketone and xanthone, and mixtures thereof. Examples of commercial initiators and synergists are Speedcure™ ITX, EHA and 3040, Irgacure™ 184, 369, 907 and 1850, Daracure™ 1173. Speedcure™, Irgacure™ and Daracure™ are registered trademarks of Lambson Plc and Ciba GmbH, respectively.

Radical initiators are included in sufficient amounts to enable curing of the compositions upon exposure to actinic radiation. Typically, such radical initiators are included in amounts of 0.1 wt % to 10 wt % of the composition, or such as from 1 wt % to 5 wt % of the composition.

Optionally, one or more colorants may be included in the resist compositions. Such colorants include pigments and dyes including fluorescing dyes. Colorants may be included in the compositions in conventional amounts to provide a desired color contrast. Suitable pigments include, but are not limited to, titanium dioxide, Prussian blue, cadmium sulfide, iron oxides, vermillion, ultramarine and the chrome pigments, including chromates, molybdates and mixed chromates and sulfates of lead, zinc, barium, calcium and mixtures and modifications thereof which are commercially available as greenish-yellow to red pigments under the names primrose, lemon, middle orange, scarlet and red chromes.

Suitable dyes include, but are not limited to, azo dyes, metal complex dyes, Naphthol dyes, anthraquinone dyes, indigo dyes, carbonium dyes, quinoneimine dyes, xanthene dyes, cyanine dyes, quinoline dyes, nitro dyes, nitroso dyes, benzoquinone dyes, naphthoquinone dyes, penoline dyes, pthalicyanine dyes and leuco dyes. Examples of fluorescent dyes are xanthenes such as rhodamine and fluorescein, bimanes, coumarins such as umbelliferone, aromatic amines such as dansyl, squarate dyes, benzofurans, cyanines, merocyanines, rare earth chelates and carbozoles.

Additional optional additives include, but are not limited to, surfactants such as non-ionic, cationic, anionic and amphoteric, slip modifiers, thioxtropic agents, foaming agents, anti-foaming agents, plasticizers, thickeners, binders, antioxidants, photoinitiator stabilizers, gloss agents, fungicides, bactericides, organic and inorganic filler particles, leveling agents, opacifiers, antistatic agents and metal adhesion agents. Such additives may be included in conventional amounts.

The resist compositions may be used as etch resists or in the alternative as plating resists. In general, the resist composition is selectively deposited on a substrate followed by curing the resist composition with actinic radiation. After curing, the uncovered sections of the substrate may be etched to a desired depth or to remove sections of the substrate surface to expose underlying layers to form a pattern on the substrate. The etchant does not remove the resist from the substrate during etching, thus the resist composition functions as an etch resist. The etch resist is then stripped from the substrate leaving a patterned substrate for further processing by conventional methods known in the art. In the alternative the uncovered sections of the substrate may be plated with a metal to form a pattern on the substrate, thus the resist functions as a plating resist. The plating resist is then stripped from the substrate leaving a substrate with a metal pattern for further processing by conventional methods known in the art. Stripping is done with a base at temperatures from 0° C. to 100° C., typically from 40° C. to 60° C.

As a variant on the above, the substrate may be selectively coated with the resist on both sides and exposed to actinic radiation. Etching and plating may then be done on both sides of the substrate simultaneously.

Etching may be done by methods known in the art appropriate to the material of which the substrate is composed. Typically, etching is done with acids, such as hydrofluoric acid, nitric acid, phosphoric acid, hydrochloric acid, organic acids, such as carboxylic acids and mixtures thereof or with industrial etches such as cupric chloride ($CuCl_2$) and ferric chloride (FeCl$_3$). Such etches are well known in the art and may be obtained from the literature.

Etching is typically done at temperatures of 20° C. to 100° C., more typically from 25° C. to 60° C. Etching includes spraying or dipping the resist coated substrate with the etchant in either a vertical or horizontal position. Typically, spraying is done when the substrate is in the horizontal position. This allows for quicker removal of the etchant. The speed of etching may be accelerated by agitating the etchant, for example, using sonic agitation or oscillating sprays. After the substrate has been treated with the etchant it is typically rinsed with water to remove traces of the etchant.

One or more metal layers may be deposited in the pattern formed on the substrate. Metals may be deposited electrolessly, electrolytically, by immersion or light induced plating. Conventional electroless, electrolytic, and immersion baths and methods may be used to deposit metal or metal alloy layers. Many such baths are commercially available or described in the literature. Metals include, but are not limited to, noble and non-noble metals and their alloys. Examples of suitable noble metals are gold, silver, platinum, palladium and their alloys. Examples of suitable non-noble metals are copper, nickel, cobalt, bismuth, zinc, indium, tin and their alloys.

Substrates include, but are not limited to, PCBs, semiconductor wafers, such as for photovoltaics and solar cells, and components for optoelectronic devices. In general, in the manufacture of PCBs, the resist composition is selectively deposited on a copper clad board and cured using actinic radiation. The sections of the copper clad board not coated with the resist are etched away. The resist is stripped from the board leaving a circuit pattern on the board. In another aspect, the resist is selectively deposited on a board made conductive with a metal seed layer using conventional processes and cured using actinic radiation. Sections of the board which are not coated with the resist are plated with a metal or metal alloy. The cured resist is then stripped from the board leaving a metal pattern on the board.

In general, in the manufacture of a photovoltaic or solar cell, the resist is selectively deposited on a front side antireflection layer of a doped semiconductor wafer. The antireflection layer may be silicon, silicon nitride Si$_3$N$_4$, silicon oxide SiO$_x$ or combinations thereof. Typically, the antireflection layer is Si$_3$N$_4$. The semiconductor may be monocrystalline or polycrystalline. The resist is then cured with actinic radiation and sections of the antireflection layer are etched away exposing the emitter layer of the doped semiconductor (n+ or n++ doped). The cured resist is then stripped and the sections of the emitter layer which are not covered by the antireflective-layer are plated with a metal or metal alloy to form a pattern of current tracks and bus bars.

In another aspect the resist may be selectively deposited on a back side of a doped semiconductor wafer which is coated with a metal, such as aluminum, copper, nickel, silver and gold. The resist is cured using actinic radiation. Sections of metal which are not covered by the resist are etched away to form a pattern of current tracks for an electrode.

The compositions and methods may be used in the manufacture of components of electronic devices, such as PCBs and lead frames, optoelectronic devices, photovoltaic devices, in the metal finishing of parts and precision tooling. They have good image definition and low flow due to their phase change nature.

The following examples are intended to further illustrate the invention but are not intended to limit its scope.

EXAMPLES 1-7

Ink Jet Etch Resist Compositions

TABLE 1

| Formulation | 1 | 2 | 3 | 4 | 5 | 6 | 7 |
|---|---|---|---|---|---|---|---|
| MONOMERS | | | | | | | |
| Isobornyl acrylate | 40 wt % | | | | | 40 wt % | |
| Tripropylene glycol diacrylate | 45 wt % | | | 35 wt % | | | 80 wt % |
| Trimethylol propane ethoxylate triacrylate | | 50 wt % | | 45 wt % | 80 wt % | | |
| Butyl acrylate | | | 60 wt % | | | 50 wt % | |
| 2-hydroxy propylacrylate | | 30 wt % | 20 wt % | | | | |
| RADICAL INITIATORS | | | | | | | |
| Isopropyl thioxanthone | 2 wt % | | | | 10 wt % | 2.5 wt % | 5 wt % |
| Hydroxy cyclohexyl phenyl ketone | 3 wt % | | 2.5 wt % | 10 wt % | | 2.5 wt % | 5 wt % |
| 2-tertiary butyl anthraquinone | | 5 wt % | 2.5 wt % | | | | |
| Benzoin isopropyl ether | | 5 wt % | | | | | |
| ACID WAXES | | | | | | | |
| Montan wax | 8 wt % | | | 10 wt % | 10 wt % | | 10 wt % |
| Esterified montanic acid | | | 10 wt % | | | 5 wt % | |
| Palmitic acid | 2 wt % | | | | | | |
| Crystalline carboxylic | | 5 wt % | | | | | |

TABLE 1-continued

| Formulation | 1 | 2 | 3 | 4 | 5 | 6 | 7 |
|---|---|---|---|---|---|---|---|
| acid terminated polyethylene wax | | | | | | | |
| Stearic acid | | 5 wt % | | | | | |

All seven formulations are prepared by the same method. The monomers, acid waxes and radical initiators are blended together to form a homogeneous mixture using conventional laboratory blending apparatus. Heating is done in a conventional convection oven at 50° C. to 90° C. to liquefy any components which are too solid to blend with the other components. After mixing each composition is then cooled to room temperature to form 100% solids compositions. The compositions are expected to have acid values of greater than 100 mg KOH/g.

All of the viscosities are expected to be 15 cp or less using a Brookfield viscometer with thermosel attachment at temperatures of 60° C., 80° C. and 100° C. Accordingly, the compositions are expected to be suitable for ink jetting using a conventional ink jet apparatus, such as a Directmask™ DoD 300 obtainable from Schmid.

EXAMPLE 8

Etch Resist PCB Application

The resist compositions from Examples 1-7 are selectively ink jetted from a piezoelectric drop-on-demand printhead (Spectra™ SE-128) onto seven separate copper clad FR4/glass-epoxy panels at a thickness of 15 μm to 30 μm. The temperature during ink jetting is from 65° C. to 95° C. After the resist compositions are selectively applied to their respective panels, the compositions are exposed to UV light at 150 mJ/cm² to 200 mJ/cm² using a Fusion D bulb running at 120 W/cm. All of the resists are expected to cure.

The hardness of each resist is tested using the ASTM D3363-05 pencil hardness test. The hardness value is expected to be 3 H or higher. The hardest value obtainable is 5 H and the softest is 1 H.

Each panel is then dipped in an aqueous etching solution of 4N $CuCl_2$ etch at 50° C. for 5 minutes to etch away sections of the copper not coated with the resist. The copper is etched to a depth of 38 μm. The resist compositions are expected to withstand the etching action of the $CuCl_2$ etch. After etching is completed the panels are removed from the etching solution and rinsed with water.

Each panel is then dipped in a bath of aqueous stripping solution of 2.5 wt % sodium hydroxide at 40° C. to 50° C. for one minute to strip the resist from the panels. Substantially all of the resist is expected to be removed from each panel leaving a copper circuit pattern on the panels. The panels are then further processed to complete the manufacture of PCBs for electronic devices.

EXAMPLE 9

Etch Resist for Semiconductor Application

Seven doped monocrystalline silicon semiconductor wafers are provided having pn-junctions. The front side or emitter layer of the doped monocrystalline silcon wafers are textured and are n++ doped. The back sides are p++ doped with aluminum. The regions between the n++ doped emitter layer and the p++ doped back sides are n+ doped. The front sides of the doped monocrystalline silicon wafers are coated with a layer of $Si_3N_4$ 500 nm thick. The $Si_3N_4$ is a dielectric which functions as an antireflective layer.

Each antireflective layer of the silicon wafers is selectively coated with one of the seven resist compositions of Examples 1-7 by a drop on demand inkjet printer at 80° C. to 100° C. for forming current tracks. The resist compositions are deposited such that the distance between each current track is 3 mm. The resists are deposited on the dielectric layer at a thickness of 10 μm. The resists are then exposed to UV light by fusion UV belt system from 150 to 2000 mJ/cm². All of the resists are expected to cure.

The hardness of each resist is tested using the ASTM D3363-05 pencil hardness test. The hardness value is expected to be 3 H or higher. The hardest value obtainable is 5 H and the softest is 1 H.

The $Si_3N_4$ dielectric layer not coated with the resist is then etched away to expose sections of the n++ doped emitter layer. Etching is done with an aqueous 40% hydrofluoric acid etch at 25° C. for 2 to 10 minutes to form current tracks 20 μm wide and 0.5 μm deep in order to expose the emitter layer. The acid etch is not expected to etch away the etch resists. The aluminum back side of the wafer is also protected from the acid etch during etching by the same resists as are applied to the front side of the wafer.

The first side of the wafer is sprayed with an aqueous stripping solution of 2.5 wt % sodium hydroxide from 40° C. to 50° C. to strip away the resist. Substantially all of the resist is expected to be removed from each wafer such that there is no residue left to compromise metal plating. The current tracks in the wafers are then plated with electroless nickel to form a nickel seed layer 0.1 μm thick. The nickel is deposited using Niplate™ 600 mid-phosphorous electroless nickel bath (obtainable from Rohm and Haas Electronic Materials, LLC, Marlborough, Mass., U.S.A.). The nickel seed layer is then coated with a layer of silver 10 μm thick. Enlight™ 600 silver plating bath (obtainable from Rohm and Haas Electronic Materials, LLC) is used to deposit the silver by conventional light induced plating.

EXAMPLE 10

Plating Resist for PCB Application

The resist compositions from Examples 1-7 are selectively ink jetted from a piezoelectric drop-on-demand printhead (Spectra™ SE-128) onto seven separate epoxy panels at a thickness of 15 μm to 30 μm. The epoxy panels have a ultra-thin copper seed layer of 1 micron. The temperature during ink jetting is from 65° C. to 95° C. After the resist compositions are selectively applied to their respective panels, the compositions are exposed to UV light at 150 mJ/cm² to 200 mJ/cm² using a Fusion D bulb running at 120 W/cm. All of the resists are expected to cure.

The hardness of each resist is tested using the ASTM D3363-05 pencil hardness test. The hardness value is expected to be 3 H or higher. The hardest value obtainable is 5 H and the softest is 1 H.

Each panel with the cured resist is placed into a copper electroplating bath containing 80 g/L of copper sulfate pentahydrate, 225 g/L of sulfuric acid, 50 ppm of chlorine ions and 1 g/L polyethylene oxide. Electroplating is done at 1 amp/dm$^2$. Copper metal is deposited on the panels in sections not coated with the resist. Copper deposition is done until the copper deposit is 15 µm to 25 µm thick.

Each panel is then dipped into a bath of aqueous stripping solution of 2.5 wt % sodium hydroxide at 40° C. to 50° C. for one minute to strip the resist from the panels. Substantially all of the resist is expected to be removed from each panel leaving a copper circuit pattern on the panels. The panels are then further processed to complete the manufacture of PCBs for electronic devices.

EXAMPLE 11

Plating Resist for Solar Cell Application

Seven doped monocrystalline silicon semicondcutor wafers are provided having pn-junctions. The front side or emitter layer of the doped monocrystalline silcon wafers are textured and are n++ doped. The back sides are p++ doped with aluminum. In addition, the back side also includes a chemical vapor deposited aluminum layer of 10 µm thick. The regions between the n++ doped emitter layer and the p++ doped back sides are n+ doped. The front sides of the doped monocrystalline silicon wafers are coated with a layer of $Si_3N_4$ 500 nm thick. The $Si_3N_4$ is a dielectric which functions as an antireflective layer.

Each aluminum layer of the silicon wafers is selectively coated with one of the seven resist compositions of Examples 1-7 by a drop on demand inkjet printer at 80° C. to 100° C. for forming current tracks on the back side of the wafers. The resist compositions are deposited such that the distance between each current track is 3 mm. The resists are deposited on the aluminum layer at a thickness of 15 µm to 30 µm. The resists are then exposed to UV light by fusion UV belt system from 150 to 2000 mJ/cm$^2$. All of the resists are expected to cure.

The hardness of each resist is tested using the ASTM D3363-05 pencil hardness test. The hardness value is expected to be 3 H or higher. The hardest value obtainable is 5 H and the softest is 1 H.

The sections of the aluminum layer not coated with the resist are then etched to remove the exposed aluminum using a conventional etching bath composed of 5 wt % acetic acid, 80 wt % phosphoric acid, 5 wt % nitric acid and 10 wt % distilled water for etching aluminum metal. The back side of each wafer is sprayed with an aqueous stripping solution of 2.5 wt % sodium hydroxide from 40° C. to 50° C. to strip away the resist. A pattern of aluminum current tracks is left on the back sid&to function as an anode.

What is claimed is:

1. A composition comprising one or more acid waxes, one or more acrylate functional monomers free of acid groups and one or more radical initiators.

2. The composition of claim 1, wherein the acid value of the one or more waxes is at least 100 mg KOH/g.

3. The composition of claim 2, wherein the acid value of the one or more waxes is 120 mg to 170 mg KOH/g.

4. The composition of claim 1, wherein the composition further comprises one or more colorants.

5. The composition of claim 1, wherein the composition is free of any acrylate functional monomers comprising acid groups.

6. A method comprising:
   a. providing a composition comprising one or more acid waxes, one or more acrylate functional monomers free of acid groups and one or more radical initiators;
   b. selectively depositing the composition on a substrate;
   c. applying actinic radiation to the composition to cure the composition;
   d. etching sections of the substrate not covered with the cured composition; and
   e. removing the cured composition from the substrate with a base to form a patterned article.

7. The method of claim 6, wherein the acid value of the one or more waxes is at least 100 mg KOH/g.

8. The method of claim 6, wherein the substrate is chosen from a component of a printed circuit board, a photovoltaic device, an optoelectronic device, metal parts and lead frames.

9. A method comprising:
   a. providing a composition comprising one or more acid waxes, one or more acrylate functional monomers free of acid groups and one or more radical initiators;
   b. selectively depositing the composition on a substrate;
   c. applying actinic radiation to the composition to cure the composition;
   d. plating metal onto the sections of the substrate not covered with the cured composition; and
   e. removing the cured composition with a base to form a patterned article.

* * * * *